United States Patent
Wang et al.

(10) Patent No.: US 8,759,225 B2
(45) Date of Patent: Jun. 24, 2014

(54) METHOD TO FORM A CMOS IMAGE SENSOR

(75) Inventors: Chung Chien Wang, Shanhua Township (TW); Yeur-Luen Tu, Taichung (TW); Cheng-Ta Wu, Shueishang Township (TW); Jiech-Fun Lu, Madou Township (TW); Chun-Wei Chang, Tainan (TW); Wang-Pen Mo, Pingtung (TW); Jhy-Jyi Sze, Hsin-Chu (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/602,494

(22) Filed: Sep. 4, 2012

(65) Prior Publication Data

US 2014/0061738 A1 Mar. 6, 2014

(51) Int. Cl.
*H01L 21/311* (2006.01)

(52) U.S. Cl.
USPC ........... 438/703; 438/514; 438/675; 438/702; 257/E21.585; 257/E21.231; 257/E21.285

(58) Field of Classification Search
USPC .......... 438/514, 703, 675, 702; 257/E21.285, 257/E21.231, E21.585
See application file for complete search history.

(56) References Cited

U.S. PATENT DOCUMENTS

| | | | | |
|---|---|---|---|---|
| 4,738,934 | A * | 4/1988 | Johnston et al. | 438/508 |
| 2006/0269867 | A1 * | 11/2006 | Uh et al. | 430/270.1 |
| 2009/0191474 | A1 * | 7/2009 | Sun et al. | 430/5 |
| 2009/0286403 | A1 * | 11/2009 | Kim et al. | 438/703 |
| 2010/0009132 | A1 * | 1/2010 | Cheng et al. | 428/195.1 |

OTHER PUBLICATIONS

Toru Inoue, et al.; "A CMOS Active Pixel Image Sensor with In-Pixel CDS for High-Speed Cameras", SPIE USE, V. 2 5301A-32 Jan. 17, 2004, p. 1-8.

* cited by examiner

*Primary Examiner* — Kyoung Lee
*Assistant Examiner* — Ratisha Mehta
(74) *Attorney, Agent, or Firm* — Eschweiler & Associates, LLC

(57) ABSTRACT

The present disclosure relates to a method and composition to limit crystalline defects introduced in a semiconductor device during ion implantation. A high-temperature low dosage implant is performed utilizing a tri-layer photoresist which maintains the crystalline structure of the semiconductor device while limiting defect formation within the semiconductor device. The tri-layer photoresist comprises a layer of spin-on carbon deposited onto a substrate, a layer of silicon containing hard-mask formed above the layer of spin-on carbon, and a layer of photoresist formed above the layer of silicon containing hard-mask. A pattern formed in the layer of photoresist is sequentially transferred to the silicon containing hard-mask, then to the spin-on carbon, and defines an area of the substrate to be selectively implanted with ions.

20 Claims, 4 Drawing Sheets

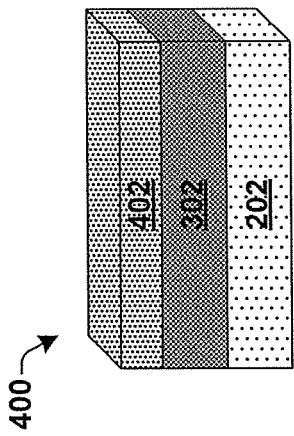
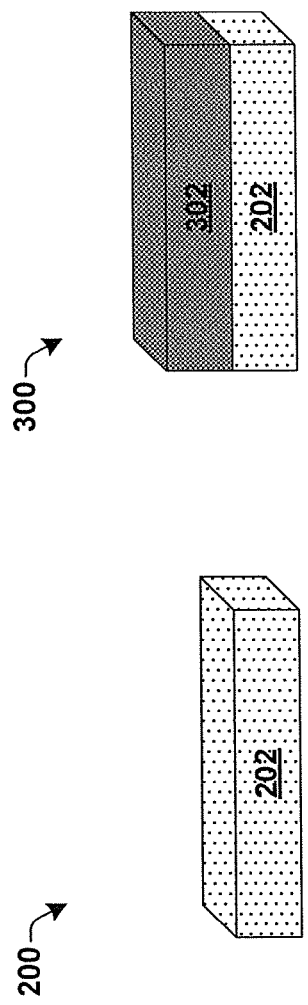
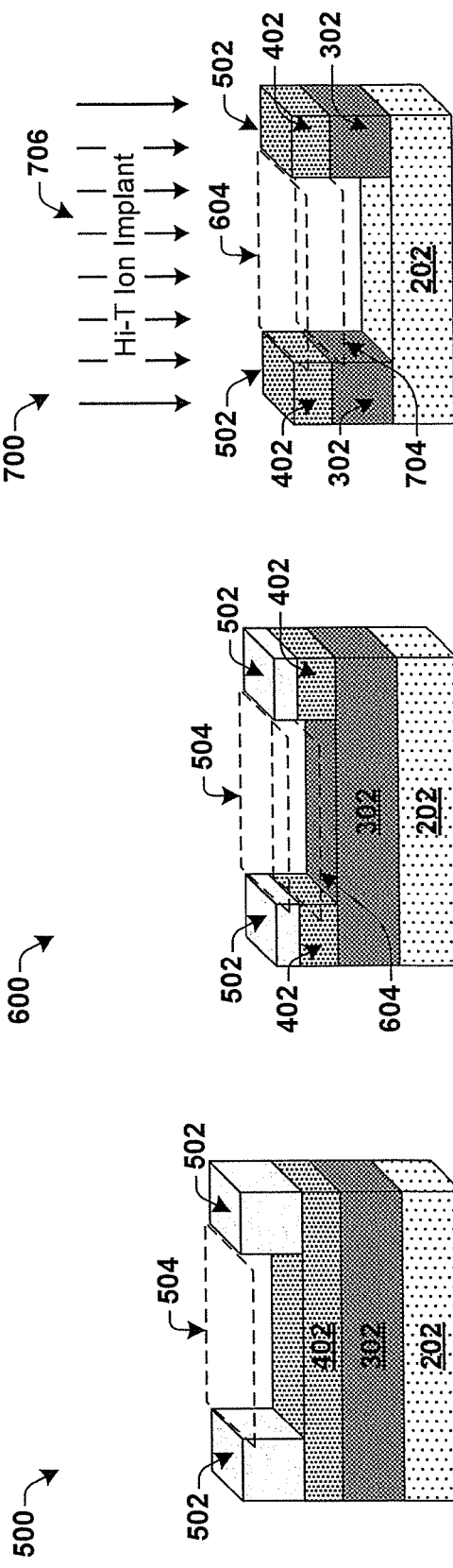

METHOD TO FORM A CMOS IMAGE SENSOR

BACKGROUND

Image sensor technology is widely used in a variety of imaging applications ranging from high-end digital camera technology to low-end cameras embedded in mobile phones. The two main types of image sensors most common to these imaging applications are charge-coupled device (CCD) image sensors and complementary metal-oxide-semiconductor (CMOS) image sensors, each of which has limitations for a given imaging application. A CMOS image sensor contains a photodiode formed on silicon through an implant process which is highly-sensitive to defect formation within a crystalline substrate used to form the photodiode, thus driving a need for mechanisms to repair defects formed within the photodiode.

BRIEF DESCRIPTION OF THE DRAWINGS

FIGS. 2-7 illustrate cross-sectional views of some embodiments of tri-layer resist formation and pattern transfer according to the method of FIG. 1.

DETAILED DESCRIPTION

Figure 1:
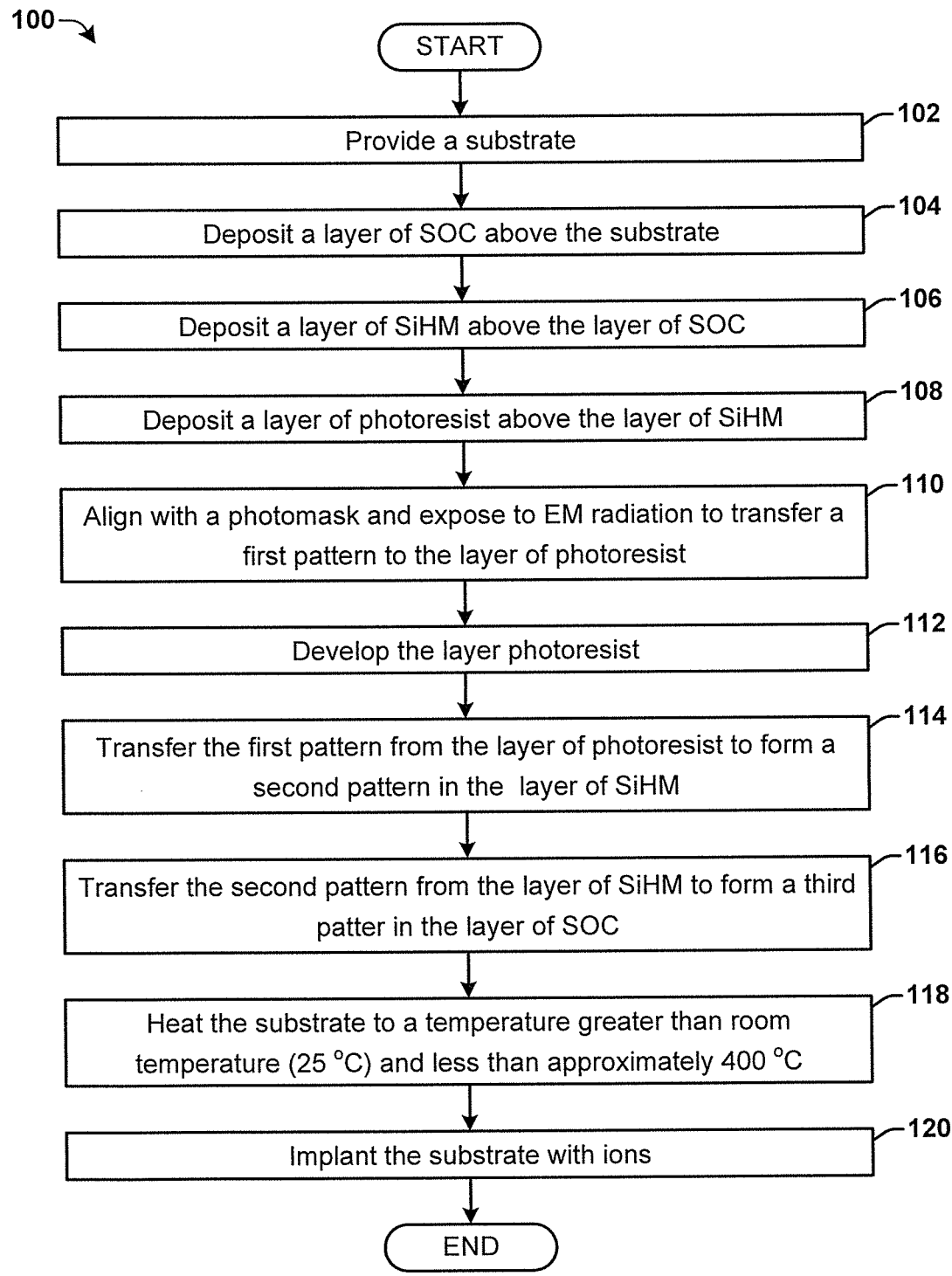
FIG. 1 illustrates a flow diagram of some embodiments of a method of ion implantation to limit crystalline defects in a semiconductor device.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Complementary metal-oxide-semiconductor (CMOS) image sensor technology offers an inexpensive alternative to charge-coupled device (CCD) image sensor technology. CMOS image sensors utilize a photodiode comprising an array of pixels formed on a substrate which comprises any semiconductor material, such as silicon, germanium, gallium arsenide, etc., through an ion implantation process. When a photon of light of sufficiently-high energy strikes a pixel it produces a photocurrent. The pixels of the photodiode are coupled to support circuitry which converts the photocurrent into digital data which comprises an optical image which can be stored, and later displayed using digital media (e.g., an image file). The pixels measure the intensity of incident light through changes in the current flow to ground when a photocurrent is produced. Thus, current leakage from the pixels resulting from crystalline defects will degrade the performance of the CMOS image sensor. This leakage can result in white pixels, wherein a pixel behaves as if it is saturated with light even if the pixel is exposed to darkness. Crystalline defects also have the effect of increasing an energy threshold to excite a photocurrent within a pixel. Since the photocurrent used to produce the optical image comprises both dark current (i.e., from pixels where light photons are not absorbed), and light current (i.e., from pixels where light photons are absorbed), the sensitivity of the photodiode may be degraded by increasing the amount of dark current.

Ion implantation during photodiode formation tends to damage a crystalline substrate (e.g., silicon), which degrades individual pixels formed from the implanted crystalline substrate. Post implant annealing is one method of crystal repair, but it cannot fully repair damage cause during ion implantation. The damage formed with proportional to an implant dosage of ions and the temperature during implantation. For instance, at a temperature of approximately 100° C. an antimony dosage greater than approximately 1e14atoms/cm$^2$ will distort a silicon crystal to create a fully-amorphous structure, while a dosage of less than 1e14atoms/cm$^2$ will essentially retain the silicon crystal structure. Increasing the temperature to approximately 200° C. allows for a dosage of up to approximately 1e15atoms/cm$^2$ before the silicon crystal is distorted. High temperature ion implantation is a means of limiting damage to the crystalline substrate. However, industry-standard photoresist cannot sustain temperatures in the range required for most high-temperature implant applications (i.e., temperatures greater than 150° C.).

Accordingly, the present disclosure relates to a method and composition to limit crystalline defects introduced in a semiconductor device during ion implantation. A high-temperature low dosage implant is performed utilizing a tri-layer photoresist which is configured to withstand increased temperatures, and maintains the crystalline structure of the semiconductor device while limiting defect formation within the semiconductor device. The tri-layer photoresist comprises a layer of spin-on carbon deposited onto a substrate, a layer of silicon containing hard-mask formed above the layer of spin-on carbon, and a layer of photoresist formed above the layer of silicon containing hard-mask. A pattern formed in the layer of photoresist is sequentially transferred to the silicon containing hard-mask, then to the spin-on carbon, and defines an area of the substrate to be selectively implanted with ions. This allows for in-situ recovery of implant damage to improve CMOS image sensor performance.

FIG. 1 illustrates a flow diagram of some embodiments of a method 100 of ion implantation to limit crystalline defects in a semiconductor device. While method 100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 102 a substrate is provided. The substrate comprises a wafer of silicon, germanium, gallium arsenide, etc.

At 104 a layer of spin-on carbon (SOC) is deposited onto the substrate.

At 106 a layer of silicon containing hard-mask (SiHM) is deposited onto the substrate above the layer of spin-on carbon.

At 108 a layer of photoresist is deposited onto the substrate above the layer of silicon containing hard-mask.

At 110 the substrate is aligned with a photomask comprising a first pattern and exposure to electromagnetic (EM) radiation such that the first pattern that defines an area of the substrate to be selectively implanted with ions is transferred to the layer of photoresist.

At 112 the layer of photoresist is reacted with a developer solution to develop the layer of photoresist, transferring the first pattern to the photoresist.

At 114 the first pattern is transferred from the layer of photoresist to form a second pattern in the layer of silicon containing hard-mask.

At 116 the second pattern is transferred from the layer of silicon containing hard-mask to form a third pattern in the layer of spin-on carbon.

At 118 the substrate is heated to a temperature greater than room temperature (25° C.) and less than approximately 400° C.

At 120 the substrate is implanted with ions through openings formed by the first pattern, the second pattern, and the third pattern.

Some embodiments of an exemplary semiconductor device, wherein such a method 100 is implemented, are illustrated in cross-sectional views of FIGS. 2-7. It will be appreciated that the cross-sectional views of FIGS. 2-7 illustrate non-limiting examples of a method of ion implantation to limit crystalline defects in a semiconductor device comprising a CMOS image sensor. One of ordinary skill in the art will appreciate that the structure of the CMOS image sensor may be achieved according to variations on the disclosed cross-sectional views.

FIG. 2 illustrates a cross-sectional view 200 of a crystalline silicon wafer 202 corresponding to the method 102, comprising a photodiode for ion implantation within a floating diffusion which is isolated by shallow trench isolation.

FIG. 3 illustrates a cross-sectional view 300 of a crystalline silicon wafer corresponding to the method 104, comprising a layer of spin-on carbon (SOC) 302 which has been deposited onto the crystalline silicon wafer 202. The layer of spin-on carbon 302 comprises between approximately 80%-85% carbon, between approximately 15%-20% oxygen, and between approximately 0%-5% hydrogen. The layer of spin-on carbon 302 is deposited via a spin-coating technique, and baked at a temperature of between approximately 150° C. to approximately 400° C. for a duration of between approximately 30 seconds and approximately 300 seconds.

FIG. 4 illustrates a cross-sectional view 400 of a crystalline silicon wafer corresponding to the method 106, comprising a layer of silicon containing hard-mask (SiHM) 402 which has been deposited onto the crystalline silicon wafer 202 above the layer of spin-on carbon 302. The layer of silicon containing hard-mask 402 comprises between approximately 35%-40% silicon, between approximately 35%-40% carbon, between approximately 15%-20% oxygen, and between approximately 0%-5% hydrogen. The layer of silicon containing hard-mask 402 is deposited via a spin-coating technique, and baked at a temperature of between approximately 15° C. to approximately 40° C. for a duration of between approximately 30 seconds and approximately 300 seconds.

FIG. 5 illustrates a cross-sectional view 500 of a crystalline silicon wafer corresponding to the methods 108-112, comprising a layer of photoresist 502 which has been deposited onto the crystalline silicon wafer 202 above the layer of silicon containing hard-mask 402. The crystalline silicon wafer 202 is subsequently aligned with a photomask (not shown) comprising a first pattern and exposure to electromagnetic (EM) radiation such that the first pattern is transferred to the layer of photoresist 502. The layer of photoresist 502 is developed with a developer solution (e.g., alkaline solution). For the embodiments of the cross-sectional view 500 the layer of photoresist 502 comprises a positive photoresist solution, wherein exposed positive photoresist becomes soluble when reacted with the developer solution, while unexposed positive photoresist becomes insoluble (i.e., same polarity). Negative photoresist solution has the opposite effect (i.e., opposite polarity). The exposed positive photoresist is removed by the developer solution to create a first opening 504 through which the substrate may be implanted with ions.

FIG. 6 illustrates a cross-sectional view 600 of a crystalline silicon wafer corresponding to the method 114, wherein the first pattern is transferred from a layer of photoresist 502 to form a second pattern in a layer of silicon containing hard-mask 402. Transferring of the first pattern comprises a wet chemical etch, dry chemical etch, plasma etch, or a combination thereof such that a first opening 504 is transferred to form a second opening 604 in the layer of silicon containing hard-mask 402.

FIG. 7 illustrates a cross-sectional view 700 of a crystalline silicon wafer corresponding to the methods 116-120, wherein the second pattern is transferred from a layer of silicon containing hard-mask 402 to form a third pattern in a layer of spin-on carbon 302. Transferring of the second pattern comprises a wet chemical etch, dry chemical etch, plasma etch, or a combination thereof such that a second opening 604 is transferred to form a third opening 704 in the layer of spin-on carbon 302. The crystalline silicon wafer 202 is then heated to a temperature greater than room temperature (25° C.) and less than approximately 400° C., and simultaneously implanted with ions 706 through the third opening 704. The ions comprise elements from III-V groups in the periodic table such as boron, phosphorus, arsenic, indium, or antimony, with an implant energy of between approximately 200 electron-volts and 4 megaelectron-volts, and a dosage of less than approximately 1e14 atoms/cm$^2$, limiting implant damage formed within the semiconductor device. The layer of spin-on-carbon and the layer of silicon containing hard-mask 402 are capable of sustaining a high-temperature implant to approximately 400° C.

Figure 8:
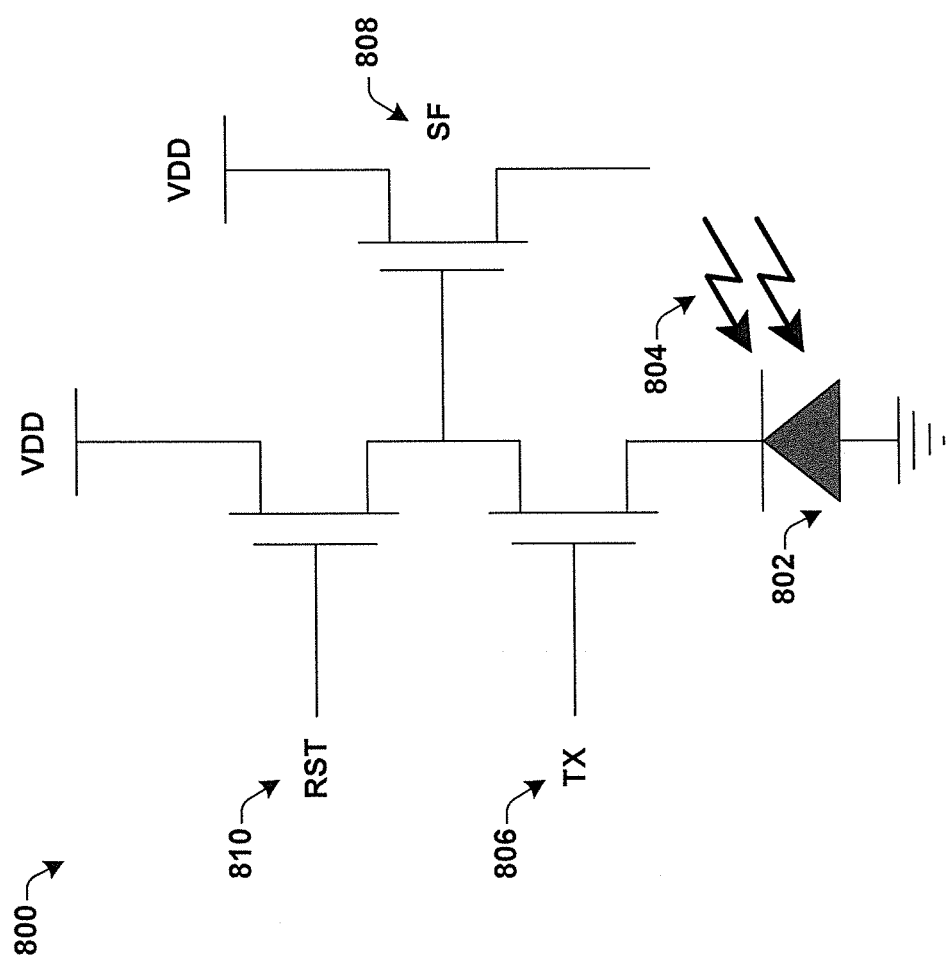
FIG. 8 illustrates an image sensor device schematic diagram.

FIG. 8 illustrates an image sensor device schematic diagram 800, comprising a photodiode 802 comprising pixels which are configured to absorb light 804 and produce a photocurrent. A transfer gate (TX) 806 is configured to transfer a photoelectronic charge of the photocurrent from the photodiode 802 to a read-out transistor (SF) 808. The read-out transistor 808 is configured to transfer the photoelectronic charge from the photodiode to support circuitry which converts the electronic charge into a digital signal. A reset transistor (RST) 810 is connected to the transfer gate 806 and configured to clear accumulated photoelectronic charge from the photodiode. When the reset transistor 810 is turned on the photodiode 802 s connected to VDD, which clears accumulated photoelectronic charge.

Figure 9:
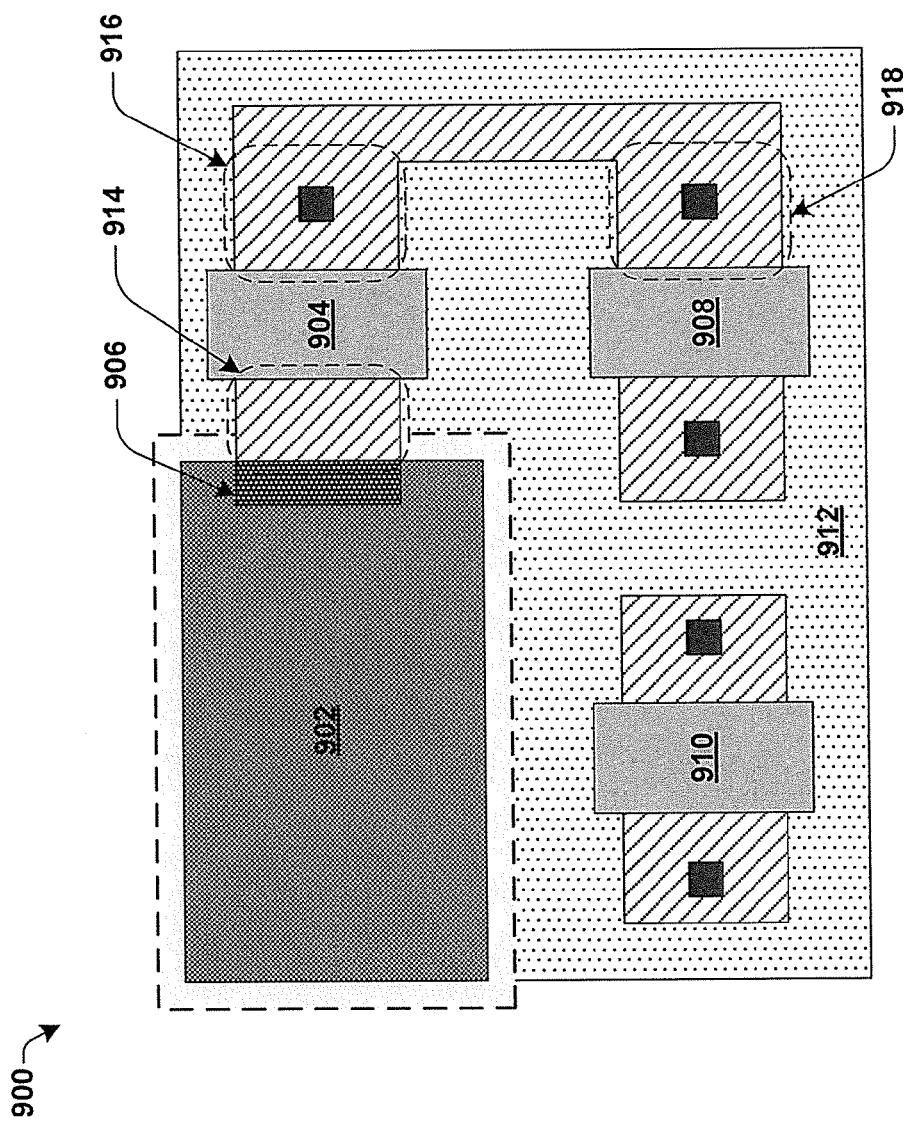
FIG. 9 illustrates some embodiments of a complementary metal-oxide-semiconductor image sensor device layout.

FIG. 9 illustrates some embodiments of a complementary metal-oxide-semiconductor (CMOS) image sensor device layout 900, comprising a photodiode 902 coupled a first source 914 of a transfer gate (TX) 904 through a floating diffusion 906 which accumulates photoelectronic charge from the photodiode 902. A reset transistor (RST) 908 configured to clear accumulated charge from the photodiode 902 shares a second source 918 with a drain 916 of the transfer gate 904. A read-out transistor (SF) 910 configured to transfer a photoelectronic charge to support circuitry which converts the electronic charge into a digital signal. The photodiode 902, transfer gate 904, floating diffusion 906, reset transistor 908, and read-out transistor 910 are embedded in a shallow trench isolation 912 configured to isolate them from each other, as well as nearby devices. In some embodiments the CMOS image sensor device layout 900 is formed by a process which comprises the embodiments of the method 100 of ion implantation. The photodiode 902 is the location of the combined opening 604 and 704 for ion implantation. Further embodiments of tri-layer resist formation and pattern transfer are illustrated in FIGS. 2-7

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a method and composition to limit crystalline defects introduced in a semiconductor device during ion implantation. A high-temperature, low dosage implant is performed utilizing a tri-layer photoresist which maintains the crystalline structure of the semiconductor device during high-temperature implantation while limiting defect formation within the semiconductor device.

In some embodiments the present disclosure relates to a method of forming an image sensor device, comprising. A tri-layer photoresist configured to withstand elevated temperatures is formed on a substrate, and patterned to form a first pattern that defines an area of the substrate. The area of the substrate is implanted with ions, wherein the substrate is baked at a temperature greater than room temperature and less than approximately 400° C.

In some embodiments the present disclosure relates to a method of forming an image sensor device, comprising a tri-layer photoresist formed over a substrate, and patterned to form a first pattern that defines an area of the substrate. The area of the substrate is implanted with ions with an implant energy of between approximately 200 electron-volts and 4 megaelectron-volts, and with an implant dosage of less than approximately 1e14atoms/cm2, wherein the substrate is baked at a temperature greater than room temperature and less than approximately 400° C.

In some embodiments the present disclosure relates to an image sensor configured to convert an optical image into an electronic signal, formed a process described in some embodiments of this disclosure. A substrate is provided and a tri-layer photoresist is formed on the substrate. The tri-layer photoresist is patterned to form a first pattern that defines an area of the substrate to be implanted with ions, wherein implanting the area of the substrate with ions forms a photodiode, with an implant energy of between approximately 200 electron-volts and 4 megaelectron-volts, and with an implant dosage of less than approximately 1e14atoms/cm2, wherein the substrate is baked at a temperature greater than room temperature and less than approximately 400° C.

What is claimed is:

1. A method of forming an image sensor device, comprising:
   forming a tri-layer photoresist on a crystalline bulk substrate;
   patterning the tri-layer photoresist to define an opening through both a silicon-containing hard mask layer and a spin-on carbon layer of the tri-layer photoresist, wherein the opening exposes a surface of the crystalline bulk substrate therethrough; and
   implanting the crystalline bulk substrate with ions through the opening while the crystalline bulk substrate is at a temperature greater than room temperature and less than approximately 400° C.

2. The method of claim 1, wherein forming the tri-layer photoresist comprises:
   forming the spin-on carbon layer on the crystalline bulk substrate;
   forming the silicon-containing hard mask layer above the spin-on carbon layer; and
   forming a photoresist layer above the silicon-containing hard-mask layer.

3. The method of claim 2, wherein forming the spin-on carbon layer on the crystalline bulk substrate further comprises:
   spin-coating the crystalline bulk substrate with the spin-on-carbon layer; and
   baking the crystalline bulk substrate at a temperature of between approximately 150° C. to approximately 400° C. for a duration of between approximately 30 seconds and approximately 300 seconds.

4. The method of claim 2, wherein forming the silicon-containing hard-mask layer above the spin-on carbon layer comprises:
   spin-coating the crystalline bulk substrate with the silicon-containing hard-mask layer; and
   baking the crystalline bulk substrate at a temperature of between approximately 150° C. to approximately 400° C. for a duration of between approximately 30 seconds and approximately 300 seconds.

5. The method of claim 2, wherein the silicon-containing hard-mask layer comprises between approximately 35%-40% carbon, between approximately 35%-40% silicon, between approximately 15%-20% oxygen, and between approximately 0%-5% hydrogen.

6. The method of claim 2, wherein the spin-on carbon layer comprises between approximately 80%-85% carbon, between approximately 15%-20% oxygen, and between approximately 0%-5% hydrogen.

7. The method of claim 2, wherein patterning the tri-layer photoresist further comprises:
   transferring a first pattern, which is defined by the opening through the silicon-containing hard-mask layer, from the of photoresist layer to form a second pattern in the silicon containing hard-mask layer; and
   transferring the second pattern from the silicon-containing hard-mask layer to form a third pattern in the spin-on carbon layer.

8. The method of claim 1, comprising implanting the crystalline bulk substrate with ions with an implant energy of between approximately 200 electron-volts and 4 megaelectron-volts.

9. The method of claim 1, comprising implanting the crystalline bulk substrate with ions with an implant dosage of less than approximately 1 e14atoms/cm2.

10. The method of claim 1, comprising implanting the crystalline bulk substrate with elements from III-V groups in a periodic table.

11. A method of forming an image sensor device, comprising:
   forming a tri-layer photoresist on a crystalline bulk substrate, the tri-layer photoresist comprising a silicon-containing hard-mask layer formed over a spin-on carbon layer, and a photoresist layer formed directly on the silicon-containing hard-mask layer;

patterning the tri-layer photoresist to form an opening through the photoresist layer, the silicon-containing hard-mask layer, and the spin-on carbon layer to expose a surface of the crystalline bulk substrate; and implanting the crystalline bulk substrate with ions through the opening while the crystalline bulk substrate is at a temperature greater than room temperature and less than approximately 400° C.

12. The method of claim 11, further comprising implanting the crystalline bulk substrate with elements from III-V groups in a periodic table.

13. The method of claim 12, wherein forming a tri-layer photoresist comprises:

spin-coating the crystalline bulk substrate with the layer of spin-on-carbon layer and baking the crystalline bulk substrate at a temperature less than approximately 400° C. for a duration of less than approximately 300 seconds;

spin-coating the crystalline bulk substrate with silicon-containing hard-mask layer and baking the crystalline bulk substrate at a temperature less than approximately 400° C. for a duration less than approximately 300 seconds; and forming the photoresist layer above the silicon-containing hard-mask layer.

14. The method of claim 1, wherein the crystalline bulk substrate is heated to a temperature of about 400° C. while the crystalline bulk substrate is implanted with ions.

15. The method of claim 2, wherein forming the tri-layer photoresist further comprises:

forming the silicon-containing hard-mask layer directly on the spin-on carbon layer; and forming the photoresist layer directly on the silicon-containing hard-mask layer.

16. The method of claim 1, further comprising forming the tri-layer photoresist directly on the crystalline bulk substrate.

17. The method of claim 1, wherein the tri-layer photoresist is configured to withstand temperatures of approximately 400° C.

18. A method of forming an image sensor device, comprising:

forming a tri-layer photoresist on a crystalline bulk substrate;

patterning the tri-layer photoresist to define an opening through both a silicon-containing hard mask layer and a spin-on carbon layer of the tri-layer photoresist, wherein the opening exposes a surface of the crystalline bulk substrate therethrough; and forming a photodiode region by implanting ions into the crystalline bulk substrate through the opening while the crystalline bulk substrate is at a temperature greater than room temperature and less than approximately 400° C.

19. The method of claim 18, wherein the crystalline bulk substrate is at a temperature of greater than 300° C. and less than about 400° C. while the ions are implanted to the crystalline bulk substrate.

20. The method of claim 18, wherein the tri-layer photoresist layer comprises a photoresist layer directly on the silicon-containing hard-mask layer.

* * * * *